(12) United States Patent
Do

(10) Patent No.: US 7,363,414 B2
(45) Date of Patent: Apr. 22, 2008

(54) PROGRAMMABLE LOGIC DEVICE INTEGRATED CIRCUIT WITH SHARED HOTSOCKET ARCHITECTURE

(75) Inventor: Toan D. Do, San Jose, CA (US)

(73) Assignee: Altera Corporation, San Jose, CA (US)

( * ) Notice: Subject to any disclaimer, the term of this patent is extended or adjusted under 35 U.S.C. 154(b) by 58 days.

(21) Appl. No.: 11/450,047

(22) Filed: Jun. 9, 2006

(65) Prior Publication Data
US 2006/0230212 A1 Oct. 12, 2006

Related U.S. Application Data

(63) Continuation of application No. 10/936,147, filed on Sep. 7, 2004, now Pat. No. 7,085,870.

(51) Int. Cl.
*G06F 13/00* (2006.01)
(52) U.S. Cl. ............................ 710/302; 710/304
(58) Field of Classification Search ........ 710/300–306; 326/33, 80–81
See application file for complete search history.

(56) References Cited

U.S. PATENT DOCUMENTS

| 5,825,206 | A | * | 10/1998 | Krishnamurthy et al. ..... 326/81 |
| 6,040,712 | A | | 3/2000 | Mejia |
| 6,549,032 | B1 | | 4/2003 | Shumarayev et al. |
| 6,630,844 | B1 | | 10/2003 | Chong et al. |
| 6,857,037 | B2 | * | 2/2005 | Messmer et al. ........... 710/300 |
| 6,870,400 | B1 | | 3/2005 | Chong et al. |
| 6,972,593 | B1 | | 12/2005 | Wang et al. |
| 7,085,870 | B2 | * | 8/2006 | Do ............................. 710/302 |

* cited by examiner

*Primary Examiner*—Raymond N Phan
(74) *Attorney, Agent, or Firm*—G. Victor Treyz

(57) ABSTRACT

Integrated circuits such as programmable logic devices are provided with hotsocket detection circuitry. The hotsocket detection circuitry monitors signals on data pins and power supply voltages. If the data pins become active before the power supply voltages have reached appropriate levels, a hotsocket condition is identified. When a hotsocket condition is identified, driver circuitry on the integrated circuit can be disabled by a hotsocket signal. Conductive paths may be used to share hotsocket detectors among multiple blocks of input-output circuitry.

20 Claims, 11 Drawing Sheets

PROGRAMMABLE LOGIC DEVICE INTEGRATED CIRCUIT WITH SHARED HOTSOCKET ARCHITECTURE

This application is a continuation of patent application Ser. No. 10/936,147, filed Sep. 7, 2004 now U.S. Pat. No. 7,085,870, which is hereby incorporated by reference herein in its entirety.

BACKGROUND OF THE INVENTION

This invention relates to integrated circuits such as programmable logic device integrated circuits, and more particularly, to hotsocket circuitry for programmable logic devices and other integrated circuits.

Integrated circuits such as programmable logic devices have power pins and data pins. The power pins on an integrated circuit chip are used to supply power supply voltages to internal circuitry on the chip. The data pins are coupled to input-output (I/O) circuits that are typically located around the periphery of the chip. Data pins are used to convey data signals to and from the I/O circuits.

The pins on an integrated circuit are often used to form communications ports. Commonly-used ports include ports that support standards such as the universal serial bus (USB) standard, the Firewire standard (IEEE 1394), etc. Electronic components that use these ports are often designed to be hot swappable. A hot-swappable component can be inserted into a system or removed from a system without powering down the system.

When a hot-swappable peripheral is connected to a powered port, it is not known in advance which pins in the port will be the first to make electrical contact with each other. If a user inserts a peripheral in one way, the power pins in the port may be the first to be electrically connected with each other. If, however, the user inserts the peripheral in a slightly different way, the data pins may be the first to make electrical contact with each other. This type of uncertainty about the order in which the data and power pins are connected must be taken into account when designing integrated circuits for hot swappable applications. For example, such circuits should be designed to avoid circuit failures in situations in which the data pins of the integrated circuit receive signals before the power supply pins have received power and before the circuits of the integrated circuit have had an opportunity to be properly powered up and establish normal operating conditions.

To provide tolerance to hot swapping, integrated circuits such as programmable logic devices have employed so-called hotsocket detectors to detect when the data pins receive signals before the power pins. This type of out-of-order scenario is often referred to as a hotsocket condition.

It would be desirable to be able to provide improved hotsocket detector circuitry on integrated circuits such as programmable logic devices.

SUMMARY OF THE INVENTION

In accordance with the present invention, programmable logic devices and other integrated circuits are provided that have improved hotsocket detection circuitry. An integrated circuit may have core logic that operates at a core power supply voltage. Input-output logic may be powered at an input-output power supply voltage that is greater than the core power supply voltage. If desired, predrivers may be provided between the core logic and input-output logic to assist in boosting signal strengths. Predrivers may be powered using a predriver power supply voltage that is greater than the core power supply voltage and the input-output power supply voltage.

The input-output logic may have a number of blocks of input-output circuitry. Each input-output block may have an input driver and an output driver. The input and output drivers may be used to convey signals between an associated data pin and the predriver or core logic.

Hotsocket detection circuitry may evaluate power supply voltages such as the core power supply voltage, the predriver power supply voltage, and the input-output power supply voltage and may evaluate data signals from the data pins to determine whether an out-of-order condition (a "hotsocket condition") exists that could damage the integrated circuit or place the integrated circuit in an undesired state. When a hotsocket condition is detected, the input and output drivers can be temporarily disabled.

Hotsocket detectors may be used to compare signals such as the input-output power supply voltage and data pin signal voltages, the input-output power supply voltage and core power supply voltage, etc. Hotsocket detector circuits can be shared among the input-output circuit blocks in a circuit. For example, all of the input-output circuit blocks in a bank of input-output circuit blocks that share the same input-output power supply voltage may use the same hotsocket detector to detect hotsocket conditions arising from the input-output power supply voltage going high before the core power supply voltage.

Further features of the invention, its nature and various advantages will be more apparent from the accompanying drawings and the following detailed description of the preferred embodiments.

BRIEF DESCRIPTION OF THE DRAWINGS

FIG. 6 shows an I/O power supply signal that may be applied to the integrated circuit.

FIG. 7 shows a core power supply signal that may be applied to the integrated circuit.

FIG. 8 shows first and second possible data pin signals that may be applied to the integrated circuit.

FIGS. 9 and 10 show the illustrative hotsocket signals that may be produced by hotsocket detector circuitry in accordance with the present invention in response to the first and second data pin signals of FIG. 8.

DETAILED DESCRIPTION

The present invention relates to ways in which to provide hotsocket detection capabilities to integrated circuits. The invention applies to any suitable integrated circuits such as digital signal processors, microprocessors, application-specific integrated circuits, etc. For clarity, the present invention will sometimes be described in the context of digital integrated circuits such as programmable logic device integrated circuits. This is, however, merely illustrative.

Figure 1:
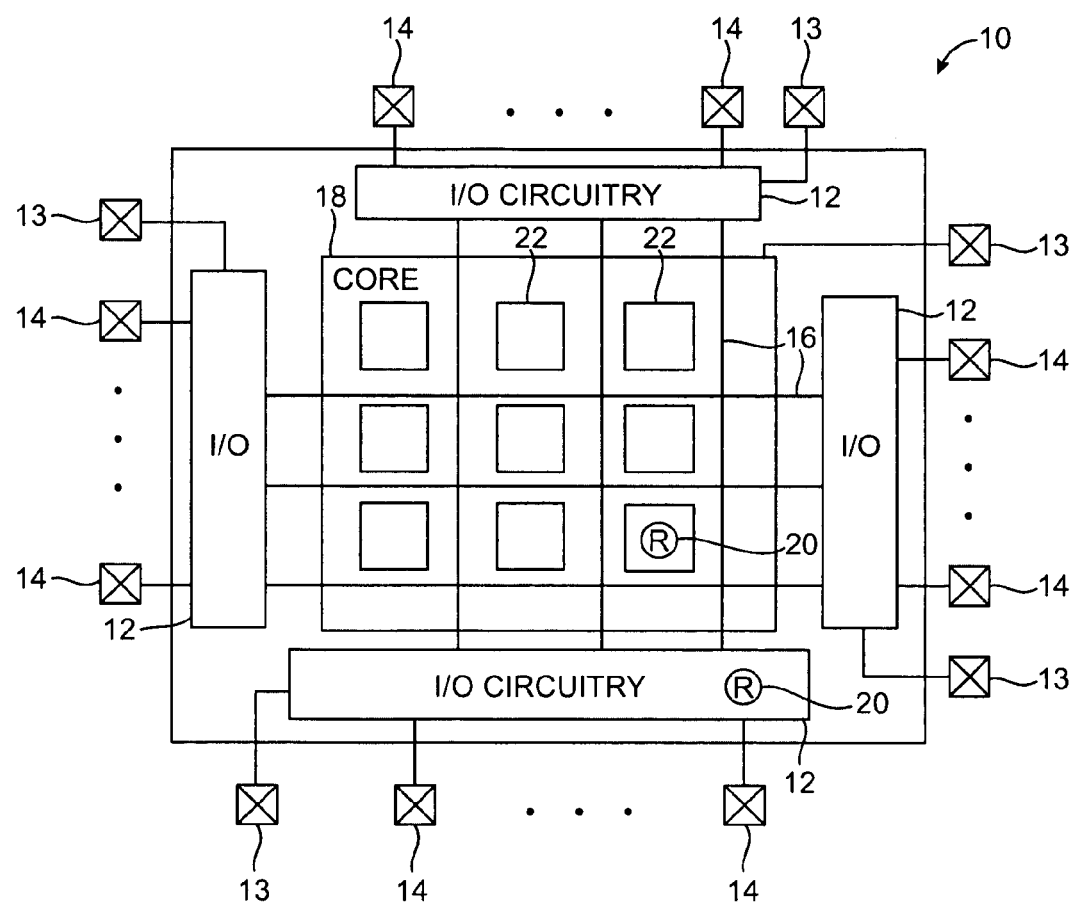
FIG. 1 is a schematic diagram of an illustrative integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output data pins 14. Power supply pins such as pins 13 may be used to provide power supply signals to device 10. Interconnection resources 16 such as vertical and horizontal conductive lines may be used to route signals on device 10.

Programmable logic device 10 may have core circuitry 18 (sometimes referred to as "core logic"). Core 18 may include combinational and sequential logic circuitry. The circuitry of device 10 such as core circuitry 18, interconnection resources 16, and I/O circuitry 12 may be customized ("programmed") by a user to perform a desired custom logic function.

Programmable logic device 10 may be based on any suitable programmable technology. With one suitable approach, configuration data (also called programming data) may be loaded into programmable elements using pins 14 and input/output circuitry 12. In the example of FIG. 1, two illustrative programmable elements 20 are shown. In general, there are numerous elements 20 on a given device. The programmable elements 20 (also sometimes called configuration bits or programmable function control elements) may each provide a static control output signal that controls the state of an associated logic component in programmable logic device.

As an example, the programmable elements 20 may be random-access memory (RAM) cells that are loaded from an external erasable-programmable read-only memory chip via pins 14 and input/output circuitry 12. The loaded RAM cells 20 provide static control signals that are applied to the terminals (e.g., gates) of circuit elements (e.g., metal-oxide-semiconductor transistors) in the programmable logic of device 10 to control those elements (e.g., to turn certain transistors on or off) and thereby configure the logic of device 10 so that it performs a desired function. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, mask-programmed programmable elements, etc.

Regardless of the particular type of programmable element arrangement that is used for device 10, programmable elements are preferably provided with configuration data by a user (e.g., a logic designer). Once provided with configuration data, the programmable elements 20 selectively control (e.g., turn on and off) portions of the circuitry in the programmable logic device and thereby customize its functions so that it will operate as desired.

The circuitry on device 10 may be controlled using signals from external sources (e.g., control signals received from other integrated circuits via input/output circuitry 12) or signals from internal circuitry such as programmable elements 20 and programmable logic in core 18 (as an example). The signals from programmable elements 20 generally do not change once device 10 has been programmed, so these signals may be referred to as static signals. The signals from the logic circuitry in device 10 generally change in real time during the operation of programmable logic device 10, so these signals may be referred to as dynamic signals.

The circuitry of device 10 may be organized using any suitable architecture. As an example, the logic of programmable logic device 10 may be organized in a series of rows and columns of one or more larger programmable logic regions or areas 22 (sometimes referred to as logic array blocks or LABs) each of which contains multiple smaller logic regions or areas (sometimes referred to as logic elements or LEs). These logic resources may be interconnected by interconnection resources 16 such as associated vertical and horizontal conductors. The interconnection conductors 16 may include global conductive lines that span substantially all of device 10, fractional lines such as half-lines or quarter lines that span a substantial part of device 10, staggered lines of a particular length (e.g., sufficient to interconnect several logic areas), smaller local lines that interconnect certain logic regions with other logic regions in a given area, or any other suitable interconnection resource arrangement. Multiplexers and other suitable circuits may be used to interconnect vertical and horizontal conductors to form various user-selected signal paths throughout device 10. If desired, the logic of device 10 may be arranged in more levels or layers in which multiple large areas are interconnected to form still larger portions of logic. Still other device arrangements may use logic that is not arranged in rows and columns.

The programmable logic of device 10 may be based on look-up tables (LUTs) or any other suitable configurable logic circuits. Logic elements (LEs) and other circuits on device 10 may contain register logic for selectively registering data signals.

If desired, dedicated circuits such as digital signal processing circuits and memory circuits may be provided on circuit 10. Dedicated circuits (sometimes called hardwired circuits even though they may have modest capabilities for being programmed or reconfigured by a user) are more efficient for performing certain tasks than general-purpose programmable logic resources such as the programmable look-up tables and registers of logic elements.

It is generally desirable to power the components in core logic 18 at a relatively low voltage (e.g., 1.2 volts or lower as advances in semiconductor processing technology permit). The power supply voltage used to power the circuitry in the core is often referred to as Vcc-core or Vcc-quiet (Vccq).

The signals that are driven off of the circuit 10 by I/O circuitry 12 and that are received by from external sources by I/O circuitry 12 generally have higher voltages (e.g., 3.3 volts as an example). This allows these signals to tolerate the noisier environments that is generally found on chip-to-chip signal busses and provides a proper interface with circuits operating at these higher voltages. As a result, it is generally desirable to supply the I/O circuitry 12 of circuit 10 with a power supply voltage in this higher voltage range. This somewhat elevated input-output circuit power supply voltage is often referred to as Vccio or Vcc-noisy (Vccn). Intermediate power supply voltages (e.g., a predriver voltage supply level Vpd) may also be used in device 10 if desired.

It is possible to design an integrated circuit that operates exclusively in well-controlled environments in which the proper power supply voltages such as Vccq and Vccn are applied to the circuit before any data signals are applied to pins 14. However, due to the popularity of hot-swappable peripherals, there is an increasing need for integrated circuits that can tolerate hot socket conditions. Such a circuit will operate properly, even if one or more of its data pins happen to receive live signals before the circuit is fully powered up.

Figure 2:
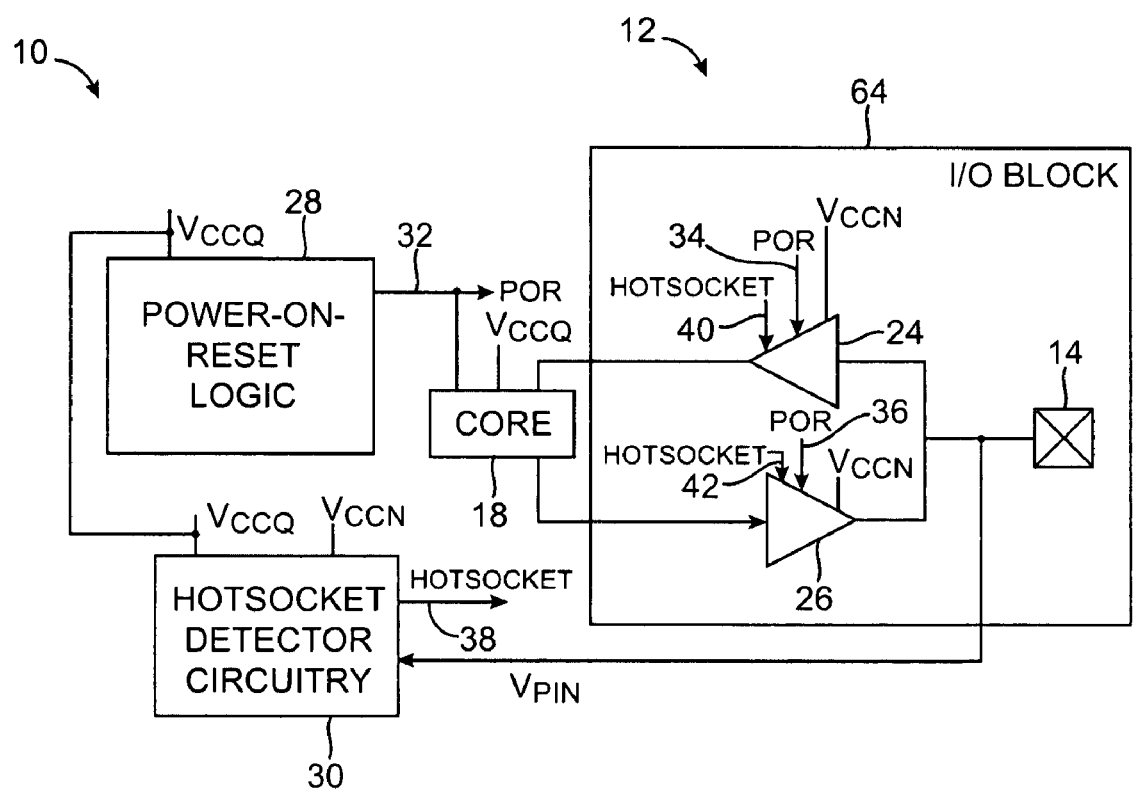
FIG. 2 is a circuit diagram of illustrative power-on-reset and hotsocket circuitry in accordance with the present invention.

In accordance with the present invention, programmable logic device 10 has circuitry for detecting hotsocket conditions and for preventing circuit damage when a hotsocket condition is detected. An illustrative circuit arrangement that may be used by device 10 is shown in FIG. 2. As shown in the example of FIG. 2, device 10 may have core logic 18 that is powered by a relatively low power supply voltage Vccq and I/O circuitry 12 that is powered by a relatively higher power supply voltage Vccn.

Data signals that are received by circuit 10 at a signal pin 14 may be provided to core 18 via input buffers such as input buffer 24. Output buffers such as output buffer 26 may be used to drive signals from core 18 off of device 10. In the arrangement of FIG. 2, one single-ended input buffer 24, one single-ended output buffer 26, and one data pin 14 are shown in a single I/O block 64. This is merely illustrative. Any suitable arrangement may be used if desired. In general, there may be numerous I/O pins 14 per integrated circuit device 10, as shown in FIG. 1, each having an associated block 64. Some or all of these pins may have only input drivers or may have only output drivers. The drivers may be differential drivers or single ended drivers. Both high-speed and low-speed (DC) drivers may be used.

Circuit 10 may have power-on-reset logic 28 and hotsocket detector circuitry 30. Power-on-reset logic 28 monitors the state of the power supply voltage Vccq and, so long as Vccq is below a predetermined acceptable threshold power level Vth, power-on-reset logic 28 produces a disable signal POR at its output 32 that disables I/O drivers 24 and 26 (via disable inputs 34 and 36). Hotsocket detector circuitry 30 monitors the power supply voltages Vccq and Vccn and the voltage in the data pin 14 (Vpin) and produces a corresponding output signal (HOTSOCKET) at output 38. The signal HOTSOCKET is applied to inputs 40 and 42 of drivers 24 and 26. During hotsocket conditions, the signal HOTSOCKET serves as a disable signal and turns off drivers 24 and 26. Disabling the drivers of I/O circuitry 12 during hotsocket conditions prevents damage and undesired circuit states that might otherwise arise if a pin voltage Vpin were to be applied to I/O circuitry 12 before the I/O circuitry and core logic 18 has been properly powered up using Vccn and Vccq.

Figure 3:
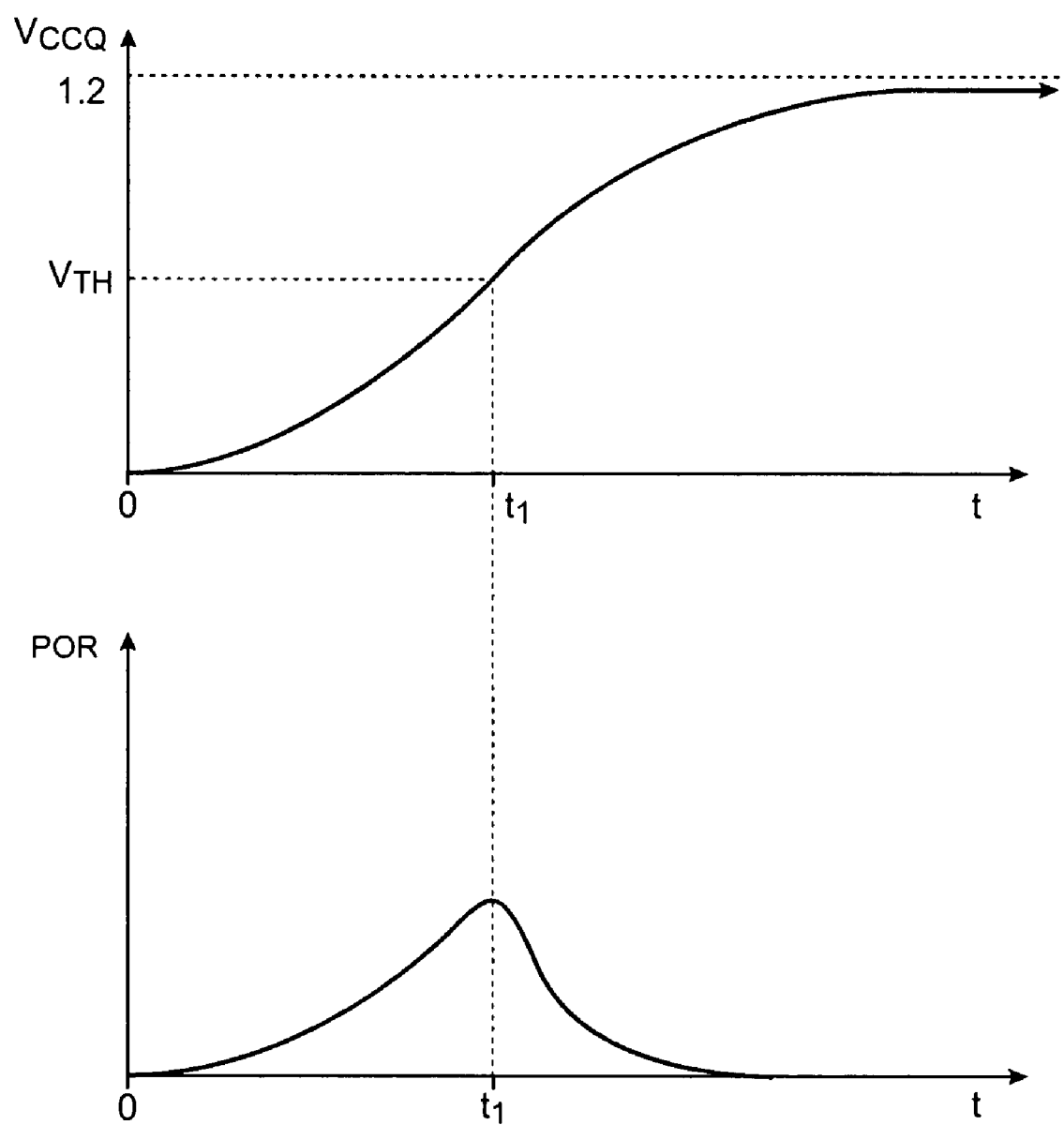
FIG. 3 shows how a power-on-reset signal may change as a function of applied power supply voltage in accordance with the present invention.

The graphs of FIG. 3 illustrate how the power-on-reset signal (POR) behaves once the core power supply voltage Vccq is applied to device 10. Initially, at time t=0, the power supply voltage applied to device 10 at the Vccq power supply pin 13 is 0 V. When the device 10 is plugged into a socket or otherwise electrically connected to a source of power supply voltage, the power supply voltage Vccq rises to its nominal value of 1.2 V (as an example), as shown in the upper trace of FIG. 2. (The voltage Vccq does not rise to 1.2 V instantly, due to capacitive loading effects.) The POR signal produced at output 32 of circuit 28 tracks the voltage of the Vccq signal until Vccq exceeds a predetermined threshold voltage Vth at time $t=t_1$, at which point the POR signal is reset to zero, as shown in the lower trace of FIG. 3. The POR signal is used as a disable signal. Between t=0 and $t=t_1$, the POR signal turns off the drivers 24 and 26 in I/O circuitry 12 and turns off the logic of core circuitry 18, so that data signals on pin 14 will not disrupt the proper operation of device 10. Once Vccq exceeds Vth, the POR signal is reset to zero, and no longer serves as a disable signal.

The signal HOTSOCKET that the hotsocket detector circuitry 30 produces also serves as a disable signal for I/O circuitry 12. When HOTSOCKET is high (in this example), the I/O circuitry 12 is turned off to prevent damage.

Figure 4:
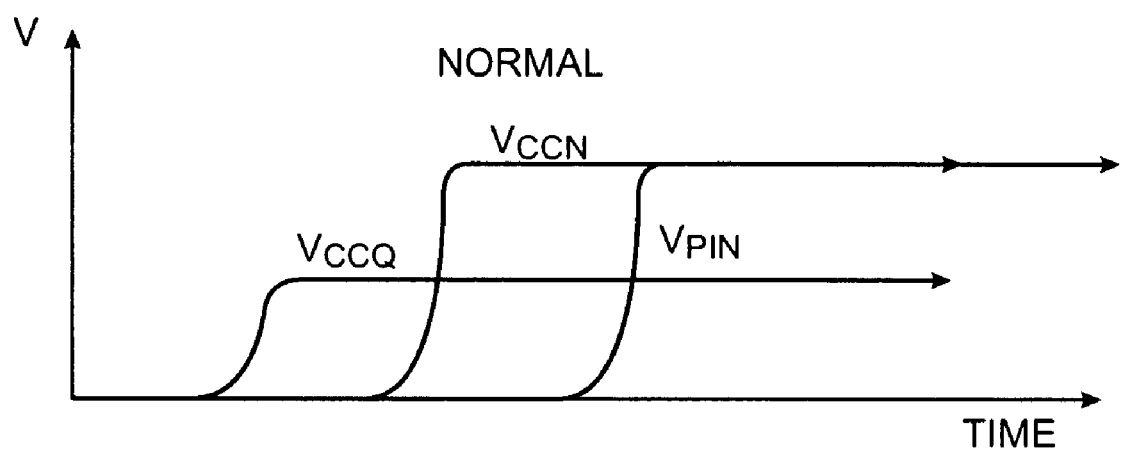
FIG. 4 is a graph showing how a normal operating condition results when certain power supply pins are properly powered in advance of data pin signals in accordance with the present invention.

Sometimes device 10 is inserted into a socket or otherwise connected to a system in a way that causes the power supply voltages Vccq and Vccn to be applied to the circuitry of device 10 before the circuitry of device 10 is exposed to live data signals. This situation is illustrated in FIG. 4. Because the core and I/O power supply voltages are applied to device 10 before data signals are received at pins 14, the core and I/O circuitry are able to properly settle into normal operation before data signals are processed. The device 10 therefore enters normal operation without the need to disable any circuitry on device 10 using the HOTSOCKET signal.

Figure 5:
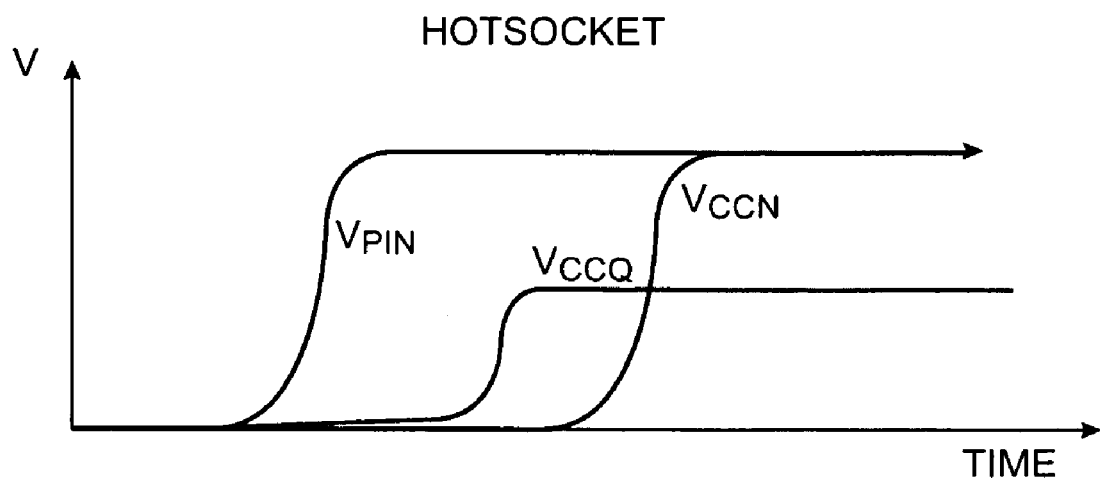
FIG. 5 is a graph showing how a hotsocket condition results when a data pin on an integrated circuit receives a live signal before the power pins on the circuit receive their power supply voltage signals in accordance with the present invention.
Figure 6:
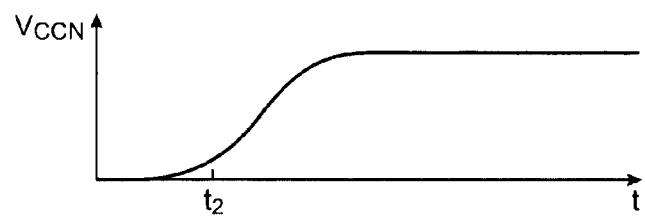
FIGS. 6-10 show how hotsocket signals may be produced in an integrated circuit when hotsocket conditions are detected in accordance with the present invention.

Sometimes device 10 is connected to a system in a way that causes the data pin signals Vpin to become active before the core power supply voltage Vccq and I/O power supply voltage Vccn have risen to their proper levels. This situation, which is shown in the graph of FIG. 5, can cause damage to device 10 if not handled properly, because active signals are at risk of being applied to circuitry 12 and 18 before circuitry 12 and 18 is ready to handle these signals. Problems can also arise if Vccn rises before Vccq. Hotsocket detector circuitry 30 therefore monitors the values of Vpin, Vccq, and Vccn, and when an out-of-order (hotsocket) condition is detected as shown in FIG. 5, circuitry 30 produces a high HOTSOCKET signal to disable drivers 24 and 26 and thereby turn off I/O circuitry 12.

The way in which hotsocket detector circuitry 30 generates the signal HOTSOCKET in response to various input conditions is shown in the examples of FIGS. 6-10. Illustrative I/O and core power supply voltages Vccn and Vccq are shown respectively in FIGS. 6 and 7. In this example, the core voltage Vccq is applied to device 10 after the I/O voltage Vccn. Both of these voltages are applied to device 10 after an active voltage Vpin is applied to the device.

Figure 9:
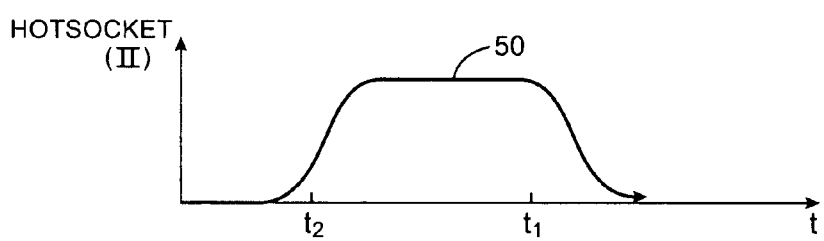
Figure 10:
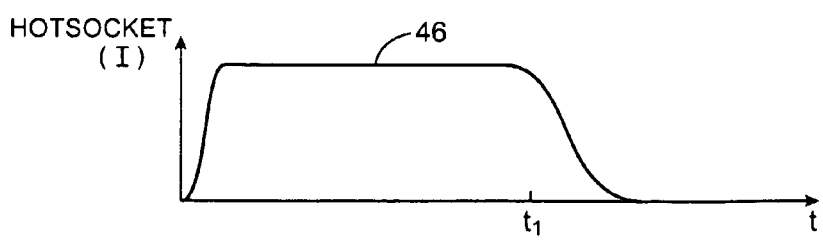

Under these circumstances, the HOTSOCKET signal that is generated by hotsocket detector circuitry 30 depends on the type of data signal Vpin that is applied. Two possibilities are illustrated in FIGS. 8-10.

As shown by line 44, one possibility is that Vpin is high. With this scenario, the hotsocket detector circuitry 30 generates a high HOTSOCKET output signal as soon as the voltage Vpin rises, as illustrated by line 46 in FIG. 10. After both power supply voltages Vccn and Vccq have turned on (after Vccq has risen past an acceptable threshold value Vth at time $t_1$ in this example), the HOTSOCKET signal may be reset to zero.

Figure 7:
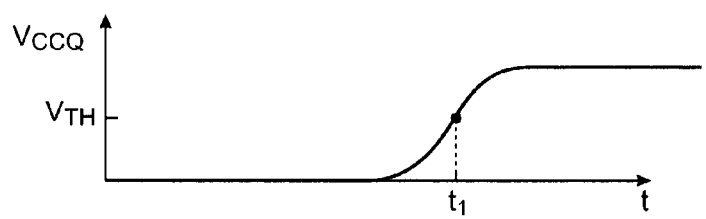
Figure 8:
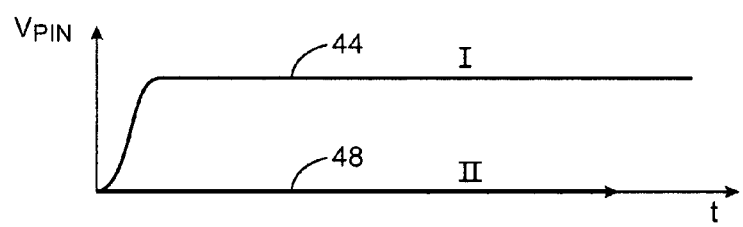

As shown by line 48 in FIG. 8, another possibility is that Vpin is low. With this scenario, it is not immediately apparent that device 10 is in a hotsocket condition, so the hotsocket detector circuitry 30 generates a high HOTSOCKET signal only after the voltage Vccn rises before Vccq at time $t_2$, as shown by line 50 in FIG. 9. After the power supply voltages Vccn and Vccq have both turned on (e.g., after Vccq has risen past an acceptable threshold value Vth at time $t_1$ as shown in FIG. 7), the HOTSOCKET signal may be reset to zero to allow device 10 to perform its intended operations.

As demonstrated by the examples of FIGS. 6-10, hotsocket detector circuitry 30 monitors the power supply signals and data signals applied to device 10 and generates a HOTSOCKET signal that can be used to disable I/O circuitry 12 whenever a hotsocket condition is detected.

Figure 11:
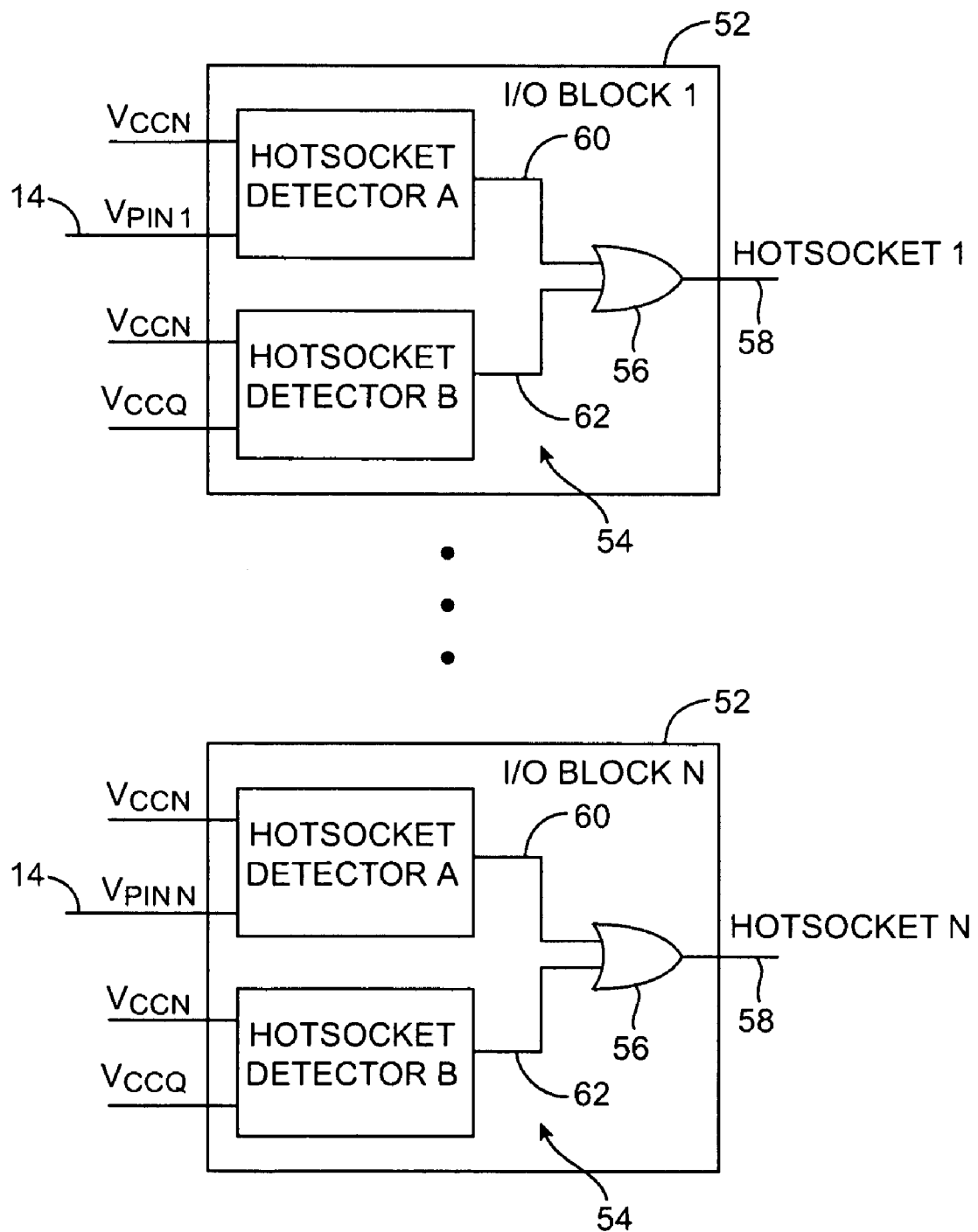
FIG. 11 is a circuit diagram of a conventional programmable logic device hotsocket detector arrangement.

Because each data pin 14 is a potential source of a damaging hotsocket condition, conventional programmable logic device integrated circuits have used a hotsocket architecture of the type shown in FIG. 11 to simultaneously monitor each data pin for a hotsocket condition. As shown in the conventional arrangement of FIG. 11, each data pin 14 has an associated I/O block 52 containing hotsocket detector circuitry 54 and an OR gate 56. The hotsocket detector circuitry 54 for each pin includes two hotsocket detectors: hotsocket detector A and hotsocket detector B.

Hotsocket detector A compares the I/O power supply signal Vccn and the data signal on pin 14 (Vpin) and generates a logic 1 at output 60 if the pin 14 is high while Vccn is low, as this would be indicative of a hotsocket condition. If Vpin is low and Vccn is high, the output 60 is a logic 0.

Hotsocket detector B compares the core power supply voltage Vccq and the I/O power supply Vccn, and generates a logic 1 if Vccq is low while Vccn is high, which is indicative of a hotsocket condition. If Vccq is high and Vccn is low, output 62 is low.

The OR gate 56 in each I/O block 52 receives outputs 60 and 62 from the hotsocket detectors A and B in that block and generates a corresponding HOTSOCKET signal for that block. For example, in the I/O block 52 that is associated with data pin No. 1, (labeled I/O block 1 in FIG. 11), if the output of the hotsocket detector A or the output of the hotsocket detector B is high, the output of OR gate 56 will be high (i.e., HOTSOCKET1 will be high) to indicate that a hotsocket condition is present on the first data pin 14. If there is no hotsocket condition, HOTSOCKET1 will be zero. The signal HOTSOCKET1 is used to selectively disable the I/O drivers associated with I/O block 1 to prevent circuit damage.

If any of data pins 14 is high before Vccn and Vccq have been properly applied to the device, that pin will be hot-socketed. Each data pin 14 is therefore a potential source of a hotsocket condition and with the conventional architecture of FIG. 11, there are two hotsocket detectors (hotsocket detectors A and B) for each I/O block. If there are N I/O blocks in a given programmable logic device, there will be 2N hotsocket detectors.

Figure 12:
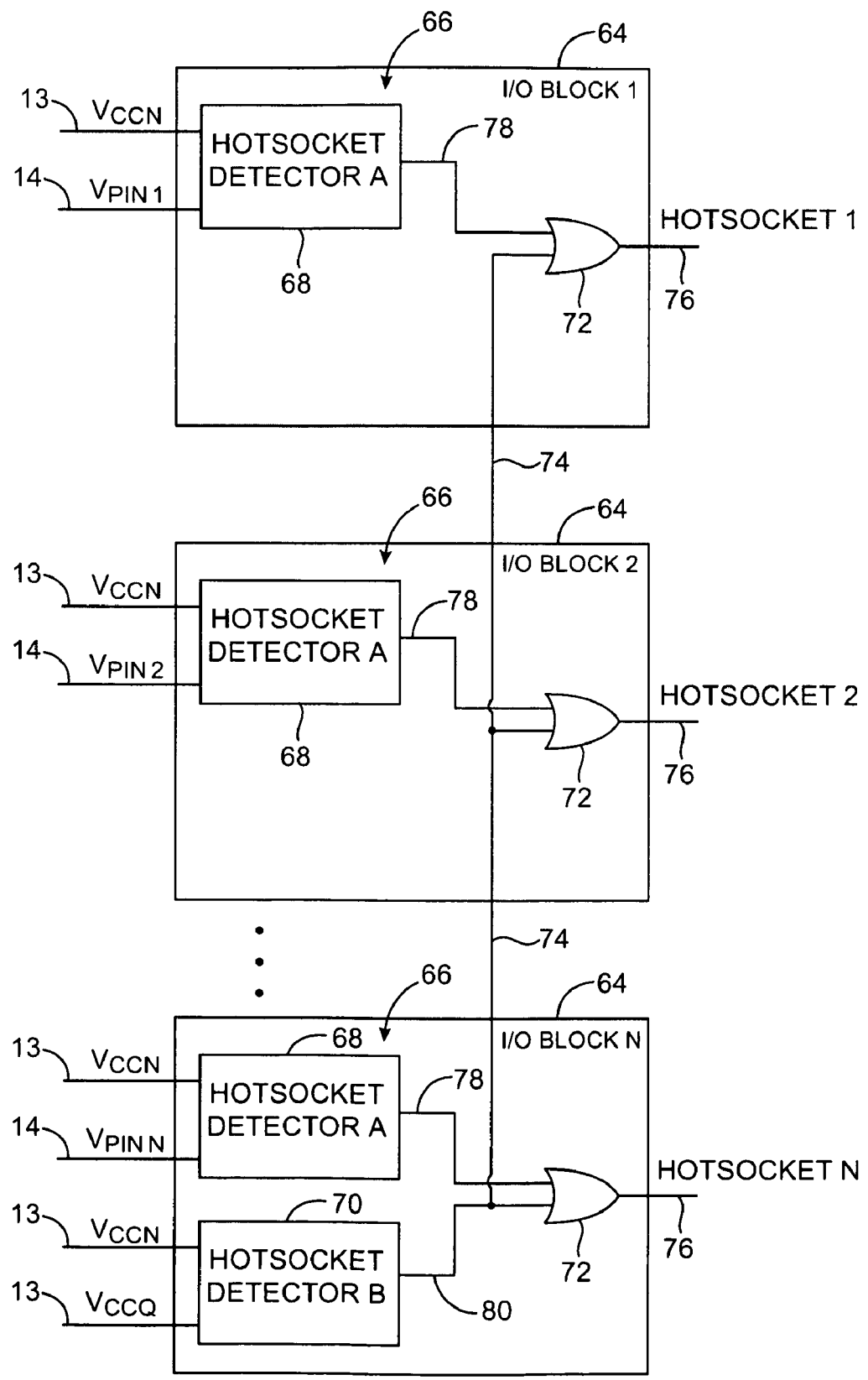
FIG. 12 is a circuit diagram of illustrative hotsocket detector circuitry in accordance with the present invention.

A hotsocket architecture in accordance with the present invention is shown in FIG. 12. As shown in FIG. 12, with this hotsocket architecture it is not necessary for every I/O block to have two hotsocket detectors 68 and 70. A single hotsocket detector 70 may be shared among multiple I/O blocks 64.

Any suitable arrangement may be used to share hotsocket detector capabilities in accordance with the present invention. With the type of arrangement shown in FIG. 12, at least one of the I/O blocks 64 in device 10 has two hotsocket detectors: hotsocket detector A and hotsocket detector B. The output of hotsocket detector B of I/O block N is shared with the other I/O blocks (i.e., I/O blocks 1 to N−1 in this example) using path 74. This arrangement conserves real estate on device 10, making device 10 less costly and complex to fabricate (and/or allowing additional functionality to be incorporated into device 10 into the area that would be otherwise consumed by additional hotsocket detectors).

As shown in FIG. 12, each I/O block 64 has hotsocket detector circuitry 66. Some I/O blocks, such as the I/O blocks associated with data pins 1 to N−1, use hotsocket detector A to monitor their inputs to determine whether an active data signal has been received before the I/O voltage Vccn has risen sufficiently to power the I/O circuitry 12 (i.e., the I/O block circuitry 64 such as the drivers associated with that pin). If Vccn goes high before the associated pin voltage in any of these I/O blocks, the corresponding output 78 of that detector A is taken high to indicate a hotsocket condition has been detected.

The I/O block 64 for the Nth pin (I/O block N) also has a hotsocket detector A that operates in this fashion. In addition, I/O block N has a hotsocket detector B that monitors the Vccn and Vccq signals. If Vccn goes high before Vccq, the output 80 of hotsocket detector B is taken high to indicate a hotsocket condition.

Path 74 distributes the hotsocket signal from hotsocket detector B from I/O block N to the other I/O blocks (blocks 1 to N−1 in this example). Each I/O block has logic such as an OR gate 72 that receives the output of the hotsocket detector A in that I/O block and that receives the shared output 80 from the hotsocket detector B in I/O block N.

The OR logic 72 in each I/O block performs a logical OR function on its inputs and provides a corresponding HOTSOCKET signal at its output 76. Logic circuitry such as OR gates 72 may be implemented using any suitable logic circuitry.

The hotsocket detectors A in each I/O block operate independently. For example, if the data signal pin in I/O block 7 goes high (Vpin7 is high) before Vccn, the output 78 of the hotsocket detector A in I/O block 7 will go high, regardless of the states of the outputs 78 for the other I/O blocks. In this situation, if the output of hotsocket detector B is low, the hotsocket signals HOTSOCKET1-HOTSOCKET6 and HOTSOCKET8-HOTSOCKETN will all be low and the I/O drivers 24 and 26 in the corresponding I/O blocks will not be disabled. Because the output 78 of the hotsocket detector A in I/O block 7 is high, however, the disable signal HOTSOCKET7 will be high. This signal, which is applied to the disable inputs of the drivers in I/O circuitry 12 (FIG. 2) will ensure that the I/O circuitry in I/O block 7 is disabled, so long as there is a hotsocket condition for I/O block 7 and its corresponding I/O data pin.

When Vccn goes high before Vccq, a more widely applicable hotsocket condition is present. This is because all of the I/O drivers that share the same Vccn signal will be affected by this hotsocket condition and will need to be disabled to prevent potential damage to the device 10. The hotsocket detector B is shared by multiple I/O blocks, as shown in FIG. 12. When hotsocket detector B senses that Vccn has become high before Vccq, the output 80 goes high and, due to the operation of OR logic 72 in each block, all of the associated hotsocket signals (i.e., HOTSOCKET1-HOTSOCKETN) will go high, regardless of the individual states of the hotsocket detectors A. Each HOTSOCKET signal serves as a disable signal for the I/O circuitry 12 for its associated I/O block 64, so when Vccn goes high before Vccq, all of the I/O circuitry 12 in I/O blocks 1-N will be disabled.

Once any detected hotsocket conditions have been resolved (i.e., when the power supply voltages Vccn and Vccq are both fully applied so that the I/O circuitry 12 and core circuitry 18 are able to function properly), the HOTSOCKET signals for I/O blocks 1-N may be reset to zero, as described in connection with FIGS. 9 and 10.

The shared hotsocket architecture of FIG. 12 conserves resources, because the hotsocket detector B that produces a hotsocket signal that is applicable to more than one I/O block is able to share its output using the conductive path 74 between I/O blocks 64. The locally generated HOTSOCKET signals that are generated by the hotsocket detector A in each I/O block are able to provide local control by turning off the driver circuitry associated with individual data pins 14 when a local hotsocket condition is detected for a particular data pin.

Figure 13:
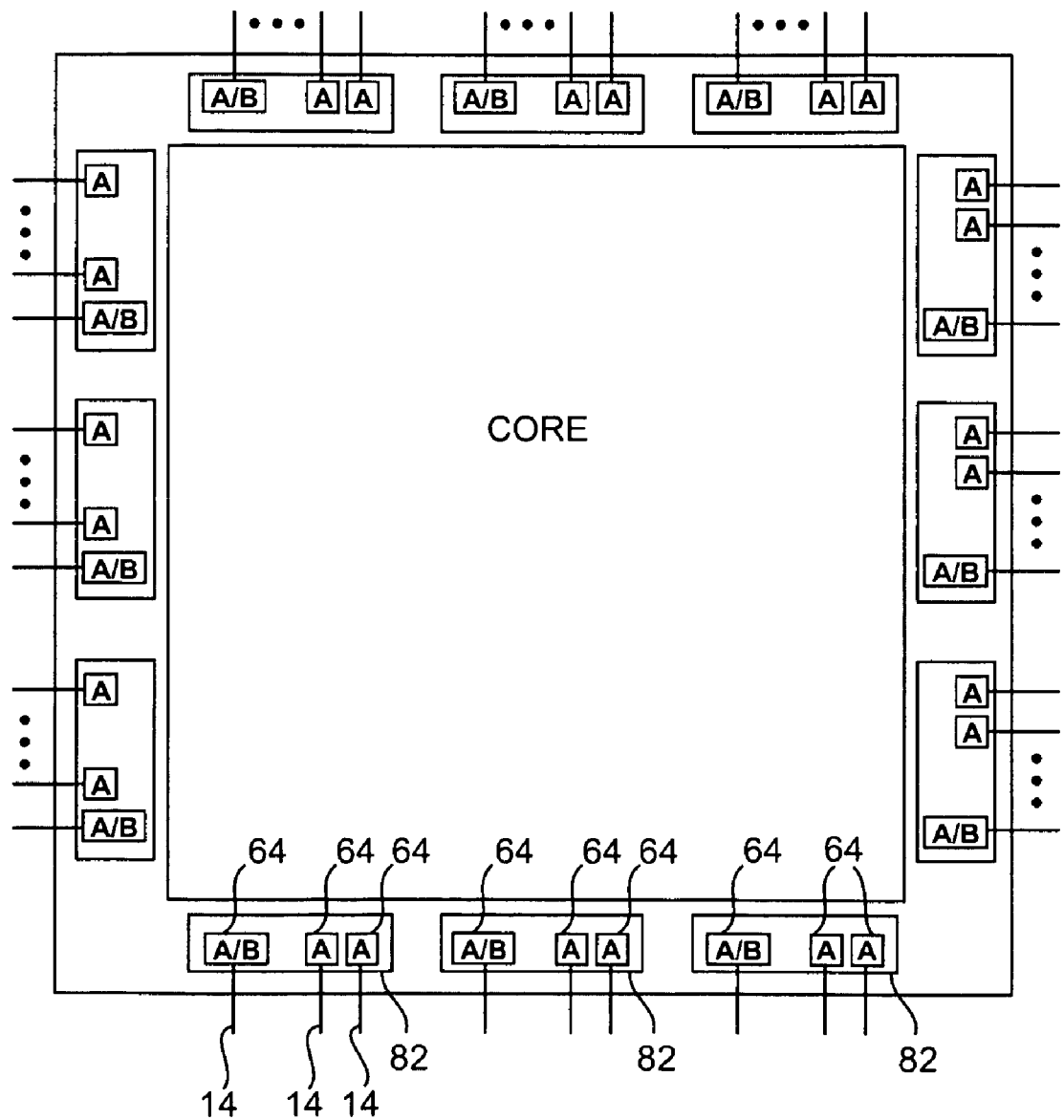
FIG. 13 is a circuit diagram of an illustrative integrated circuit using a hotsocket detector architecture in accordance with the present invention.

In the example of FIG. 12, a single hotsocket detector B is shared among N I/O blocks and N associated data pins 14. If desired, all I/O blocks on a programmable logic device or other integrated circuit 10 may be controlled using a single detector B or groups of I/O blocks may each be controlled by an associated detector B. An illustrative arrangement in which I/O blocks 64 are organized into groups called "I/O banks" is shown in FIG. 13. With arrangements of the type shown in FIG. 13, each I/O bank 82 may have multiple associated I/O blocks (e.g., N I/O blocks as shown in FIG. 12). One (or more than one) of the I/O blocks 64 in each bank 82 may include both a hotsocket detector A and a hotsocket detector B (as with I/O block N in FIG. 12). In FIG. 13, these I/O blocks are labeled "A/B" to indicate that hotsocket detectors A and B are both present. The other I/O blocks 64 in each bank, which are labeled "A" in FIG. 13, need only have a hotsocket detector A in their hotsocket detector circuitry 66.

In one suitable arrangement, device 10 has multiple I/O banks as shown in FIG. 13, each of which has I/O circuitry 12 powered by a different Vccn signal. Each I/O bank may, for example, have an associated Vccn power supply pin 13 though which that I/O bank receives its Vccn signal. With this type of arrangement, each Vccn signal is used to power the I/O circuitry 12 in a respective bank. Because the Vccn signal for each I/O bank operates independently (in this example), there is a hotsocket detector B in at least one of the I/O blocks 64 in each bank that is used to detect whether that bank's Vccn signal has gone high before Vccq. If so, the path 74 in that bank is used to distribute the output of the hotsocket detector B in the bank to the OR gates 72 in the bank. When the hotsocket detector B detects a hotsocket condition, the I/O circuitry 12 in the entire bank is turned off to prevent damage to the circuit 10 from the hotsocket condition. If the hotsocket detector B does not detect a hotsocket condition, the I/O circuitry in each I/O block in the bank will be enabled, so long as no hotsocket detectors A detect a local hotsocket condition associated with a particular data pin in the bank.

Figure 14:
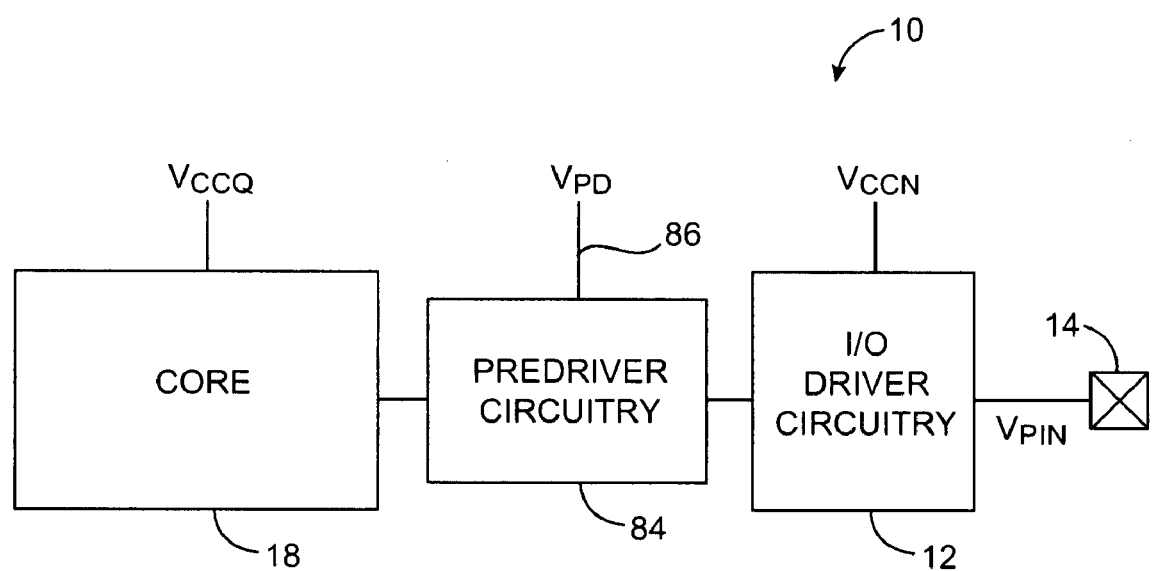
FIG. 14 is a circuit diagram of illustrative integrated circuit circuitry having core circuitry, predriver circuitry, and I/O driver circuitry in accordance with the present invention.

In some integrated circuits such as programmable logic devices, it may be desirable to provide predriver circuitry to boost data signal strengths. An illustrative circuit arrangement that uses predriver circuitry is shown in FIG. 14. In device 10 of FIG. 14, core circuitry 18 operates at a reduced voltage supply level of Vccq (e.g., 1.2 volts), which helps to reduce power consumption in circuit 10. The I/O driver circuitry 12 operates at a higher voltage supply level of Vccn (e.g., 3.3 volts), which allows the signals produced by I/O driver circuitry 12 to interface with external integrated circuits operating at higher voltages and which makes the signals driven off of circuit 10 more tolerant to noise. Predriver circuitry 84 is powered by an intermediate voltage supply Vpd (e.g., 2.5 volts supplied at terminal 86) and is used to strengthen 1.2 volt signals from core 18 before these signals are driven off of circuit 10 through pin 14 by I/O driver circuitry 12.

Without the predriver circuitry 84, the transistors in the output driver in I/O circuitry would need to be larger, to ensure that sufficient drive current is produced when these transistors are driven with the 1.2 volt signals from core 18. Using predriver circuitry 84, the 1.2 volt signals from core 18 are converted to 2.5 volt signals before these signals are provided to I/O driver circuitry 12. By applying larger 2.5 volt signals to I/O driver circuitry 12, the sizes of the drive transistors in circuitry 12 may be reduced, while still maintaining a suitable output drive capability.

Figure 15:
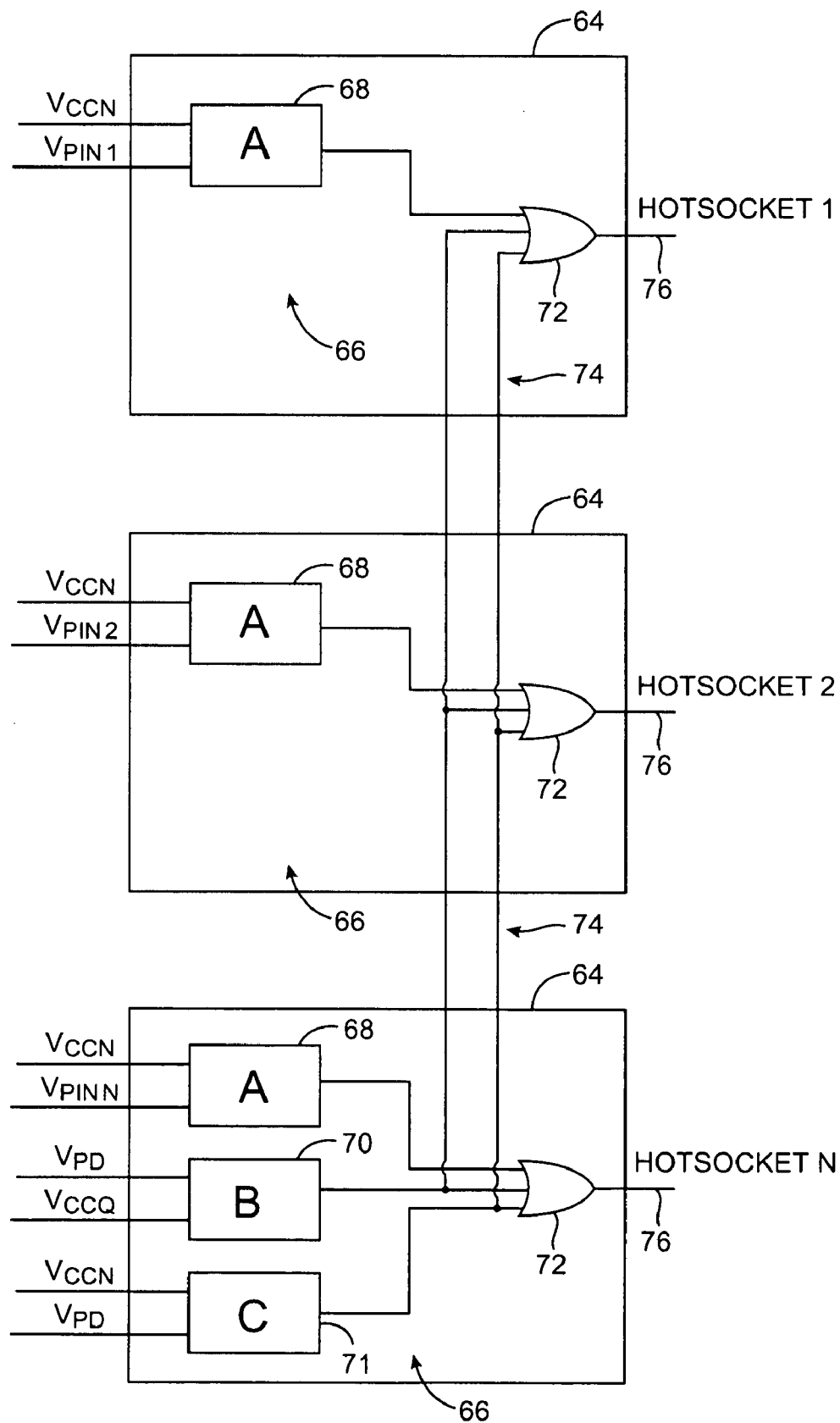
FIG. 15 is a circuit diagram of illustrative hotsocket, detector circuitry for use in an integrated circuit having core, predriver, and I/O circuits of the type shown in FIG. 14 in accordance with the present invention.

In a circuit environments in which there are three voltage supply voltages (Vccq, Vpd, and Vccn), a hotsocket detector circuit arrangement of the type shown in FIG. 15 may be used. As shown in FIG. 15, each I/O block 64 may have a hotsocket detector 68 that compares the data pin voltage for that I/O block with the voltage Vccn to detect a hotsocket condition for that I/O block. If the output of hotsocket detector A in a particular block is high, the HOTSOCKET output of the corresponding OR gate 72 in that block will be high, which will disable the I/O driver circuitry in that block to prevent circuit damage.

One block 64 (or more than one block) may have hotsocket detectors 70 and 71 in its hotsocket detector circuitry 66. Detector 70 (labeled B in FIG. 15) is used to compare Vpd and Vccq. If Vpd goes high before Vccq, the output of hotsocket detector B is taken high to indicate a hotsocket condition. The output of detector B is distributed to the inputs of the OR gates 72 of I/O blocks 64 via path 74, so that the circuitry of hotsocket detector B need not be replicated in each I/O block.

Hotsocket detector C compares the voltages Vccn and Vpd. If the voltage Vccn goes high before Vpd, the output of hotsocket detector C will go high to indicate a hotsocket condition. The output of detector C is distributed to the inputs of the OR logic 72 in each I/O block using the conductive path 74, which serves as a bus for distributing the hotsocket signals between I/O blocks.

With the arrangement of FIG. 15, the HOTSOCKET signals that are provided at outputs 76 are used to selectively disable the I/O driver circuitry associated with each data pin to prevent damage to circuit 10. If a data pin goes high before Vccq, the HOTSOCKET signal associated with that data pin will go high to disable the appropriate I/O drivers. If hotsocket detector B or hotsocket detector C detects a hotsocket condition, the shared outputs provided to OR gates 72 via path 74 will ensure that all of the HOTSOCKET signals go high as long as the hotsocket condition persists. The HOTSOCKET signals generated by detectors B and C will disable the I/O circuitry 12 in all of the I/O blocks connected to path 74 until the power supply voltages Vccq, Vpd, and Vccn have been established at proper levels for normal circuit operation.

The voltage Vpd may be distributed in I/O banks as described in connection with the distribution of Vccn in FIG. 13. With this type of arrangement, there may be (as an example) a detector B and a detector C for each bank. If desired, the voltages Vpd and Vccn may be distributed to different groups of I/O blocks. For example, there may be a single Vpd for the entire circuit or there may be multiple Vpd signals, each associated with a respective one of multiple banks of I/O drivers. In general, the distribution arrangement used for the hotsocket detectors A, B, and C can be selected to provide a independent detector for each individually varying supply voltage, without over-provisioning. This minimizes the consumption of real estate on circuit 10 by the hotsocket detector circuitry, while maintaining the ability of the hotsocket detector circuitry to selectively disable portions of the integrated circuit. Other arrangements are also possible. For example, the HOTSOCKET outputs of each I/O block may be combined using one or more OR gates and these combined signals used to selectively enable/disable I/O circuitry on circuit 10.

Figure 16:
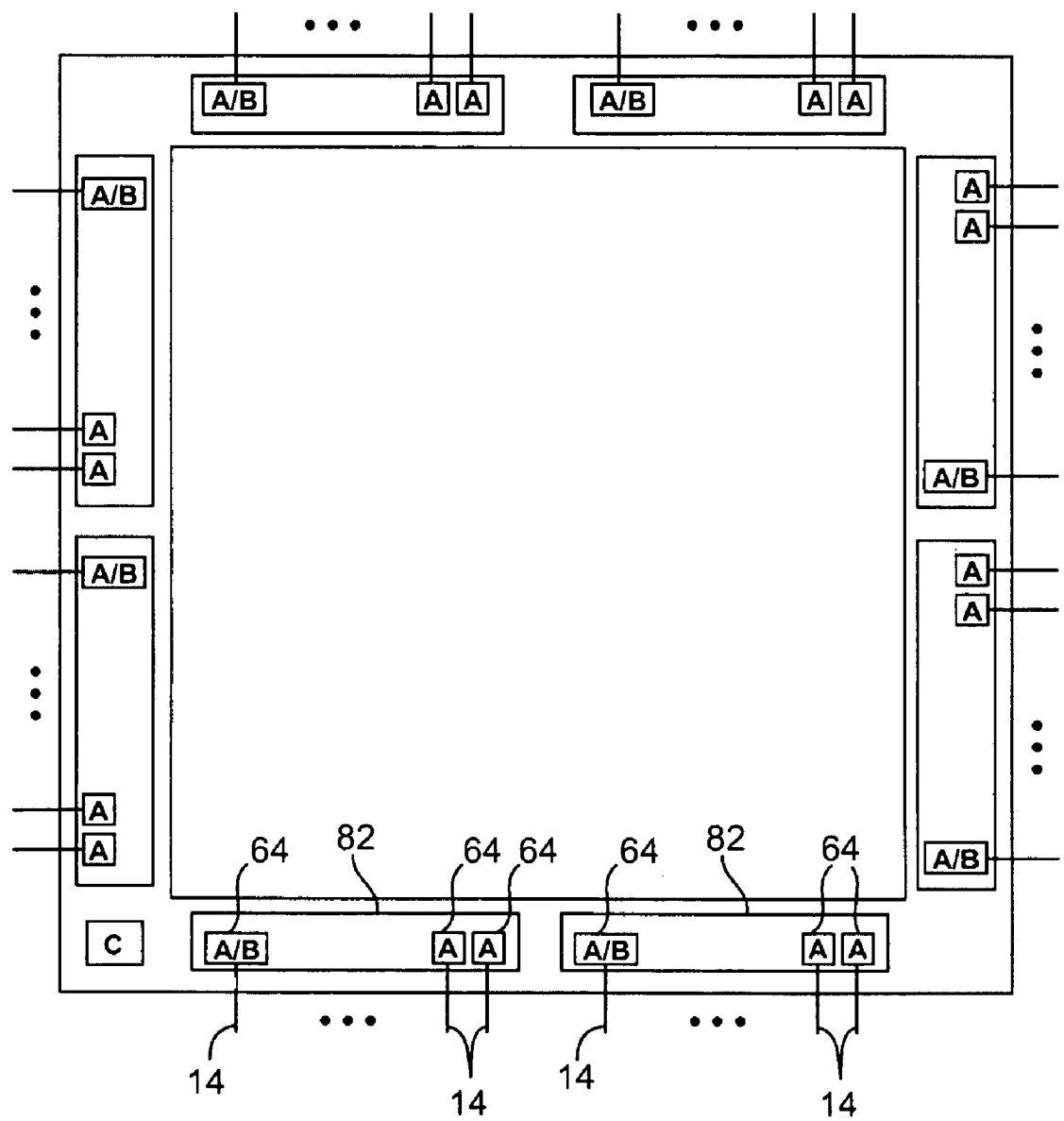
FIG. 16 is a circuit diagram of an illustrative integrated circuit having core, predriver, and I/O circuits and that has a hotsocket detector architecture in accordance with the present invention.

An illustrative arrangement using hotsocket detectors A, B, and C is shown in FIG. 16. With the illustrative arrangement of FIG. 16, each I/O block 64 has an associated hotsocket detector A. Each I/O bank 82 has an associated hotsocket detector B that is co-located with the A detector in one of the I/O blocks 64 for that bank and labeled "A/B" in FIG. 16. The hotsocket detector C may be shared by all of the banks 84, so only a single hotsocket detector C is shown in the illustrative example of FIG. 16.

The foregoing is merely illustrative of the principles of this invention and various modifications can be made by those skilled in the art without departing from the scope and spirit of the invention.

What is claimed is:

1. An integrated circuit comprising:
   a plurality of input drivers that are selectively enabled and disabled using control signals;
   a plurality of associated data pins that supply data signals to the input drivers;
   first hotsocket circuitry that compares the data signals on the data pins to a first power supply signal and that generates a disabling control signal for each input driver whose data input pin is active when the first power supply signal is not active;
   a conductive path that distributes a signal that is common to each of the input drivers; and
   second hotsocket circuitry that compares second and third power supply signals and that uses the conductive path to disable all of the input drivers if the third power supply signal has a larger voltage than the second power supply signal.

2. The integrated circuit defined in claim 1 further comprising input-output circuit blocks, each of which contains a respective one of the input drivers, wherein the first power supply signal is an input-output power supply signal that is used to power the input-output circuit blocks.

3. The integrated circuit defined in claim 1 further comprising input-output circuit blocks, each of which contains a respective one of the input drivers, wherein the first power supply signal is an input-output power supply signal that is used to power the input-output circuit blocks and wherein the second power supply signal is equal to the first power supply signal.

4. The integrated circuit defined in claim 1 further comprising input-output circuit blocks, each of which contains a respective one of the input drivers, wherein the first power supply signal is an input-output power supply signal that is used to power the input-output circuit blocks and wherein the second power supply signal is different than the first power supply signal.

5. The integrated circuit defined in claim 1 further comprising core logic, wherein the third power supply voltage is a core power supply signal that is used to power the core logic.

6. The integrated circuit defined in claim 1 further comprising core logic, wherein the third power supply voltage is a core power supply signal that is used to power the core logic and wherein the first power supply signal and the second power supply signal are equal.

7. The integrated circuit defined in claim 1 further comprising core logic, wherein the third power supply voltage is a core power supply signal that is used to power the core logic and wherein the first power supply signal and the second power supply signal are different.

8. The integrated circuit defined in claim 1 wherein the first power supply signal is an input-output power supply signal that is used to power the input drivers, the integrated circuit further comprising core logic, wherein the third power supply voltage is a core power supply signal that is used to power the core logic.

9. The integrated circuit defined in claim 1 wherein the first power supply signal is an input-output power supply signal that is used to power the input drivers, the integrated circuit further comprising core logic, wherein the third power supply voltage is a core power supply signal that is used to power the core logic and wherein the second power supply signal is equal to the first power supply signal.

10. The integrated circuit defined in claim 1 wherein the first power supply signal is an input-output power supply signal that is used to power the input drivers, the integrated circuit further comprising core logic, wherein the third power supply voltage is a core power supply signal that is used to power the core logic and wherein the second power supply signal is different than the first power supply signal.

11. The integrated circuit defined in claim 1 further comprising programmable core logic, wherein the first power supply signal is an input-output power supply signal that is used to power the input drivers and wherein the third power supply voltage is a core power supply signal that is used to power the programmable core logic.

12. The integrated circuit defined in claim 1 further comprising:
   core circuitry powered with the third power supply signal; and
   predriver circuitry powered with the second power supply signal, wherein the input drivers are powered with the first power supply signal, wherein the second hotsocket circuitry compares the first and second power supply signals and disables the input drivers when the second power supply signal is larger than the first power supply signal.

13. A integrated circuit comprising:
   programmable core logic;
   programmable elements that supply static control signals that configure the programmable core logic to perform custom logic functions;

a plurality of input drivers that are selectively enabled and disabled using control signals;

a plurality of associated data pins that supply data signals to the input drivers;

first hotsocket circuitry that compares the data signals on the data pins to a first power supply signal and that generates a disabling control signal for each input driver whose data input pin is active when the first power supply signal is not active;

a conductive path that distributes a signal that is common to each of the input drivers; and second hotsocket circuitry that compares second and third power supply signals and that uses the conductive path to disable all of the input drivers if the third power supply signal has a larger voltage than the second power supply signal.

14. The integrated circuit defined in claim 13 further comprising input-output circuitry that contains the input drivers, wherein the first power supply signal is an input-output power supply signal that is used to power the input-output circuitry and wherein the third power supply voltage is a core power supply signal that is used to power the programmable core logic.

15. The integrated circuit defined in claim 13 further comprising input-output circuitry that contains the input drivers, wherein the first power supply signal is an input-output power supply signal that is used to power the input-output circuitry, wherein the third power supply voltage is a core power supply signal that is used to power the programmable core logic, and wherein the first power supply signal and the second power supply signal are equal.

16. The integrated circuit defined in claim 13 further comprising input-output circuitry that contains the input drivers, wherein the first power supply signal is an input-output power supply signal that is used to power the input-output circuitry, wherein the third power supply voltage is a core power supply signal that is used to power the programmable core logic, and wherein the first power supply signal and the second power supply signal are different.

17. The integrated circuit defined in claim 13 further comprising:

input-output circuitry that contains the input drivers;

predriver circuitry powered with the second power supply signal, wherein the input drivers are powered with the first power supply signal and wherein the second hotsocket circuitry compares the first and second power supply signals and disables the input drivers when the second power supply signal is larger than the first power supply signal.

18. The integrated circuit defined in claim 13 further comprising:

input-output circuitry that contains the input drivers;

predriver circuitry powered with the second power supply signal, wherein the input drivers are powered with the first power supply signal, wherein the second hotsocket circuitry compares the first and second power supply signals and disables the input drivers when the second power supply signal is larger than the first power supply signal, and wherein the third power supply voltage is a core power supply signal that is used to power the programmable core logic.

19. The integrated circuit defined in claim 13 further comprising:

a plurality of banks of input-output circuit blocks, each input-output circuit block in a given one of the banks containing a respective one of the input drivers; and predriver circuitry powered with the second power supply signal, wherein the input drivers are powered with the first power supply signal, wherein the second hotsocket circuitry compares the first and second power supply signals and disables the input drivers in the given one of the banks when the second power supply signal is larger than the first power supply signal, and wherein the third power supply voltage is a core power supply signal that is used to power the programmable core logic.

20. The integrated circuit defined in claim 13 further comprising:

a plurality of banks of input-output circuit blocks, each input-output circuit block in a given one of the banks containing a respective one of the input drivers, wherein each input driver has at least one control input;

a plurality of OR gates, each OR gate having at least first and second inputs and having an output coupled to a respective one of the input driver control inputs; and predriver circuitry powered with the second power supply signal, wherein the input drivers are powered with the first power supply signal, wherein the second hotsocket circuitry compares the first and second power supply signals and disables the input drivers in the given one of the banks when the second power supply signal is larger than the first power supply signal, wherein the third power supply voltage is a core power supply signal that is used to power the programmable core logic, wherein the first hotsocket circuitry provides a respective output signal to the first input of each the OR gate, and wherein the second hotsocket circuitry uses the conductive path to provide an output signal to the second input of each OR gate.

* * * * *